(12) United States Patent
Li

(10) Patent No.: US 10,297,509 B2
(45) Date of Patent: May 21, 2019

(54) SEMICONDUCTOR DEVICE AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Yong Li, Shanghai (CN)

(73) Assignees: SEMICONDUCTOR MANUFACTURING INTERNATIONAL (SHANGHAI) CORPORATION, Shanghai (CN); SEMICONDUCTOR MANUFACTURING INTERNATIONAL (BEIJING) CORPORATION, Beijing (CN)

( * ) Notice: Subject to any disclaimer, the term of this patent is extended or adjusted under 35 U.S.C. 154(b) by 0 days.

(21) Appl. No.: 16/005,307

(22) Filed: Jun. 11, 2018

(65) Prior Publication Data
US 2018/0301382 A1    Oct. 18, 2018

(30) Foreign Application Priority Data

Jun. 14, 2017    (CN) .......................... 2017 1 0448937

(51) Int. Cl.
| | | |
|---|---|---|
| H01L 21/8238 | (2006.01) | |
| H01L 27/092 | (2006.01) | |
| H01L 21/324 | (2006.01) | |
| H01L 23/535 | (2006.01) | |
| H01L 21/768 | (2006.01) | |
| H01L 29/45 | (2006.01) | |

(52) U.S. Cl.
CPC .... *H01L 21/823814* (2013.01); *H01L 21/324* (2013.01); *H01L 21/76889* (2013.01); *H01L 23/535* (2013.01); *H01L 27/092* (2013.01); *H01L 29/456* (2013.01)

(58) Field of Classification Search
CPC .......... H01L 21/823814; H01L 29/456; H01L 21/76889; H01L 21/324; H01L 27/092; H01L 23/535
See application file for complete search history.

(56) References Cited

U.S. PATENT DOCUMENTS 9,166,050 B2 * 10/2015 Zhou .................. H01L 29/1054
9,871,035 B2 *  1/2018 Hung ................ H01L 21/82341
(Continued)

*Primary Examiner* — Earl N Taylor
(74) *Attorney, Agent, or Firm* — Anova Law Group, PLLC

(57) ABSTRACT

A semiconductor device and a method for fabricating the semiconductor device are provided. The method includes providing a base substrate including a first region and a second region; and forming a first doped region in the first region, and a second doped region in the second region. The second doped region is doped with blocking ions. The method also includes forming a first metal layer on a surface of the first doped region and on a surface of the second doped region; and forming a second metal layer on a surface of the first metal layer. The second metal layer is made of a material different from the first metal layer. Further, the method includes forming a first metal silicide layer and a second metal silicide layer by performing an annealing process. The blocking ions block atoms of the second metal layer from diffusing into the second metal silicide layer.

20 Claims, 5 Drawing Sheets

(56) References Cited

U.S. PATENT DOCUMENTS

| | | | | |
|---|---|---|---|---|
| 10,121,700 B2* | 11/2018 | Li | ................ | H01L 21/02164 |
| 2006/0011996 A1* | 1/2006 | Wu | ................ | H01L 21/28097 |
| | | | | 257/412 |
| 2016/0020325 A1* | 1/2016 | Xie | ................ | H01L 27/092 |
| | | | | 257/192 |
| 2018/0301382 A1* | 10/2018 | Li | ................ | H01L 21/82381 |
| 2018/0366555 A1* | 12/2018 | Li | ................ | H01L 29/665 |

* cited by examiner

SEMICONDUCTOR DEVICE AND FABRICATION METHOD THEREOF

CROSS-REFERENCES TO RELATED APPLICATIONS

This application claims the priority of Chinese patent application No. 201710448937.9, filed on Jun. 14, 2017, the entirety of which is incorporated herein by reference.

FIELD OF THE DISCLOSURE

The present disclosure generally relates to the field of semiconductor manufacturing technology and, more particularly, relates to a semiconductor device and fabrication method thereof.

BACKGROUND

Metal-oxide-semiconductor (MOS) transistor is one of the most important components in modern integrated circuits. The basic structure of the MOS transistor includes a semiconductor substrate, a gate structure formed on the semiconductor substrate, and source and drain doped regions formed in the semiconductor substrate on both sides of the gate structure. In the MOS transistor, a switch signal is generated by applying a voltage on the gate structure to adjust a current in a channel under the gate structure.

The MOS transistor includes an N-type MOS transistor and a P-type MOS transistor. A first metal silicide on the surface of the source and drain doped regions of the N-type MOS transistor desires to be selected with an appropriate material, to enable a low first Schottky barrier between the first metal silicide on the surface of the source and drain doped regions and the source and drain doped regions in the N-type MOS transistor. A second metal silicide on the surface of the source and drain doped regions of the P-type MOS transistor desires to be selected with an appropriate material, to enable a low second Schottky barrier between the second metal silicide on the surface of the source and drain doped regions and the source and drain doped regions in the P-type MOS transistor. Accordingly, to meet requirements of the first Schottky barrier between the first metal silicide and the source and drain doped regions in the N-type MOS transistor and the second Schottky barrier between the second metal silicide and the source and drain doped regions in the P-type MOS transistor, respectively, the first metal silicide in the N-type MOS transistor is made of a material different from the second metal silicide in the P-type MOS transistor.

However, existing methods for fabricating a semiconductor device including the N-type MOS transistor and the P-type MOS transistor is complicated and still needs to be improved. The disclosed device structures and methods are directed to solve one or more problems set forth above and other problems.

BRIEF SUMMARY OF THE DISCLOSURE

One aspect of the present disclosure includes a method for fabricating a semiconductor device. The method includes providing a base substrate including a first region and a second region; and forming a first doped region in the first region of the base substrate, and a second doped region in the second region of the base substrate. The second doped region is doped with blocking ions. The method also includes forming a first metal layer on a surface of the first doped region and on a surface of the second doped region; and forming a second metal layer on a surface of the first metal layer. The second metal layer is made of a material different from the first metal layer. Further, the method includes forming a first metal silicide layer and a second metal silicide layer by performing an annealing process. The first metal layer and the second metal layer on the first doped region react with a surface material of the first doped region to form the first metal silicide layer. The first metal layer on the second doped region reacts with a surface material of the second doped region to form the second metal silicide layer including the blocking ions. The blocking ions block atoms of the second metal layer from diffusing into the second metal silicide layer.

Another aspect of the present disclosure includes a semiconductor device. The semiconductor device includes a base substrate including a first region and a second region. The semiconductor device also includes a first doped region in the first region of the base substrate, and a second doped region in the second region of the base substrate. The second doped region is doped with blocking ions. Further, the semiconductor device includes a first metal silicide layer on the first doped region, and a second metal silicide layer on the second doped region. The first metal silicide layer is a reaction product of a first metal layer and a second metal layer on the first doped region with a surface material of the first doped region, and the second metal silicide layer is a reaction product of the first metal layer on the second doped region with a surface material of the second doped region. The second metal silicide layer includes the blocking ions.

Other aspects of the present disclosure can be understood by those skilled in the art in light of the description, the claims, and the drawings of the present disclosure.

DETAILED DESCRIPTION

Figure 1:
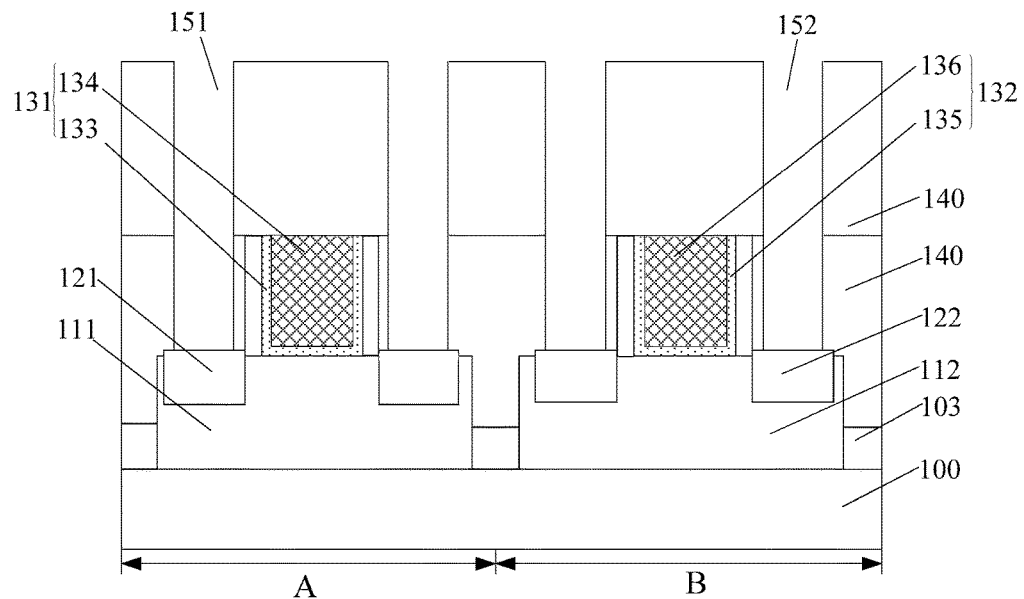
FIGS. 1-7 illustrate semiconductor structures corresponding to certain stages for forming an exemplary semiconductor device consistent with various disclosed embodiments of the present disclosure.

Reference will now be made in detail to exemplary embodiments of the disclosure, which are illustrated in the accompanying drawings. Wherever possible, the same reference numbers will be used throughout the drawings to refer to the same or the alike parts.

A semiconductor device may be formed from a base substrate including a first region and a second region. The first region is used to form a P-type transistor and the second region is used to form an N-type transistor. The fabrication method also includes forming a first doped region in the first region of the base substrate, and a second doped region in the second region of the base substrate. In addition, the fabrication method includes forming a first metal silicide layer on a surface of the first doped region using a first metal-silicide process. Moreover, the fabrication method includes forming a second metal silicide layer on a surface of the second doped region using a second metal-silicide process. The first metal silicide layer is made of a material different from the second metal silicide layer.

For example, the first metal silicide layer in the P-type MOS transistor desires to be selected with an appropriate material, to enable a low Schottky barrier between the first metal silicide layer and the first doped region in the P-type MOS transistor. The second metal silicide layer in the N-type MOS transistor desires to be selected with an appropriate material, to enable a low Schottky barrier between the second metal silicide layer and the second doped region in the N-type MOS transistor. To meet requirements of corresponding Schottky barriers in the N-type MOS transistor and the P-type MOS transistor, respectively, the first metal silicide layer in the P-type MOS transistor is made of a material different from the second metal silicide layer in the N-type MOS transistor.

The first metal silicide layer is formed by a reaction between a first metal layer and a surface material of the first doped region. The second metal silicide layer is formed by a reaction between a second metal layer and a surface material of the second doped region. The first metal silicide layer and the second metal silicide layer are formed in different processes, respectively, such that the material of the second metal silicide layer is not affected by the first metal layer, and the material of the first metal silicide layer is not affected by the second metal layer. However, because the first metal silicide layer and the second metal silicide layer are formed in different processes, respectively, the process complexity increases.

The present disclosure provides a semiconductor device and a method for forming the semiconductor device, for example, with simplified process. A first metal layer may be formed on a surface of a first doped region and a surface of a second doped region, and a second metal layer may be formed on a surface of the first metal layer. The second metal layer may be made of a material different from the first metal layer. By performing an annealing process, the first metal layer and the second metal layer on the first doped region may react with a surface material of the first doped region to form a first metal silicide layer, and the first metal layer on the second doped region may react with a surface material of the second doped region to form a second metal silicide layer including blocking ions. The blocking ions may block atoms of the second metal layer from diffusing into the second metal silicide layer.

Figure 6:
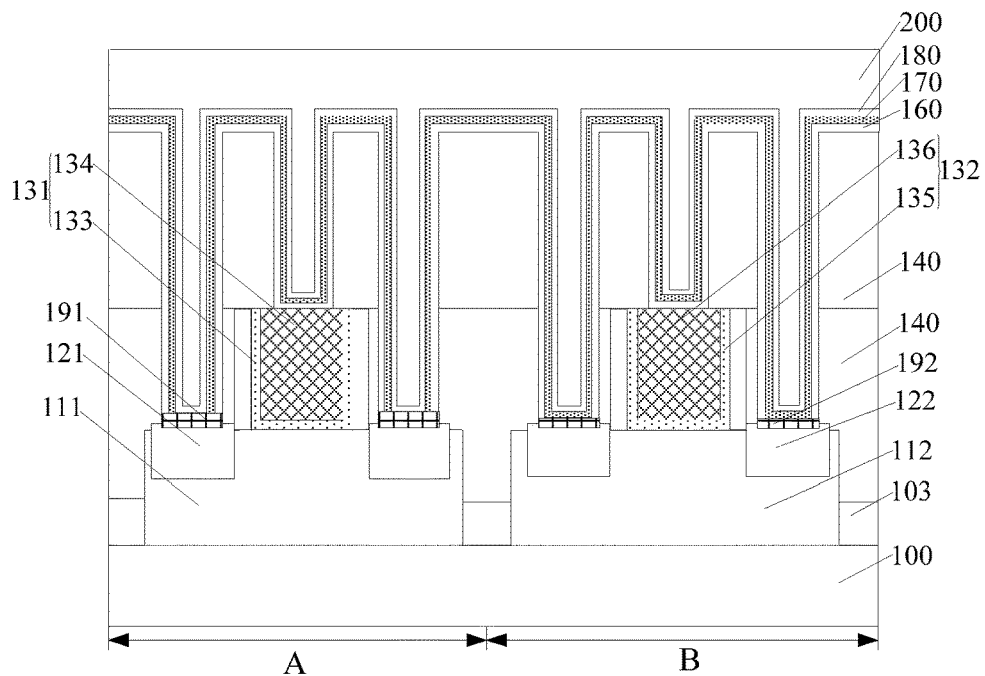
Figure 7:
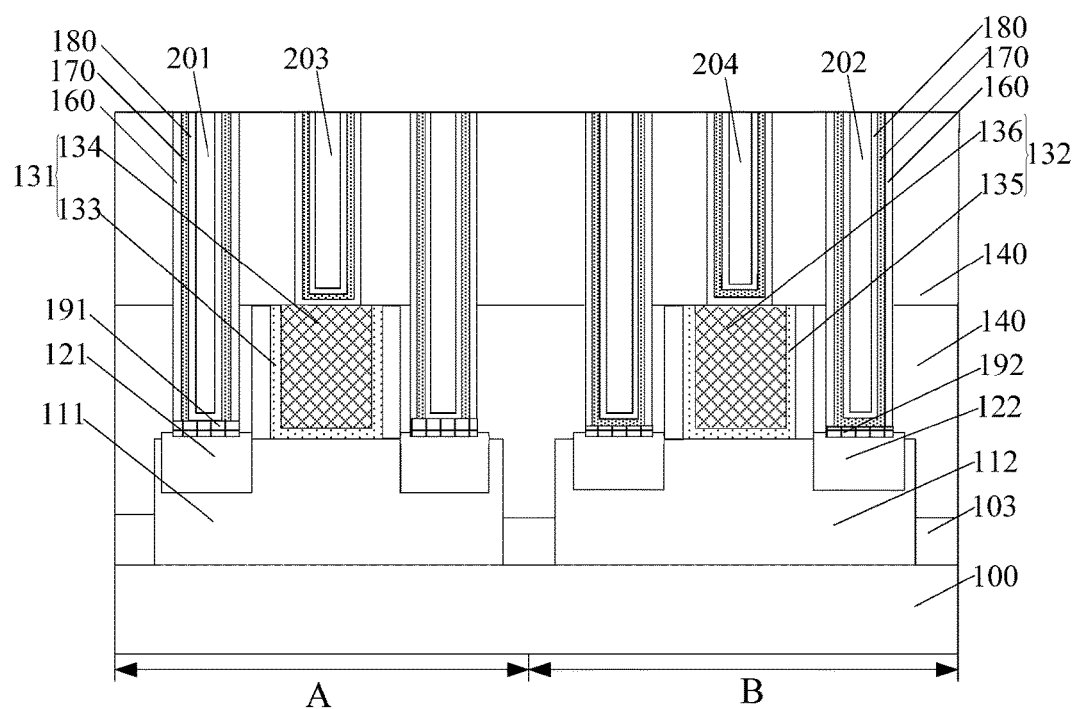
Figure 8:
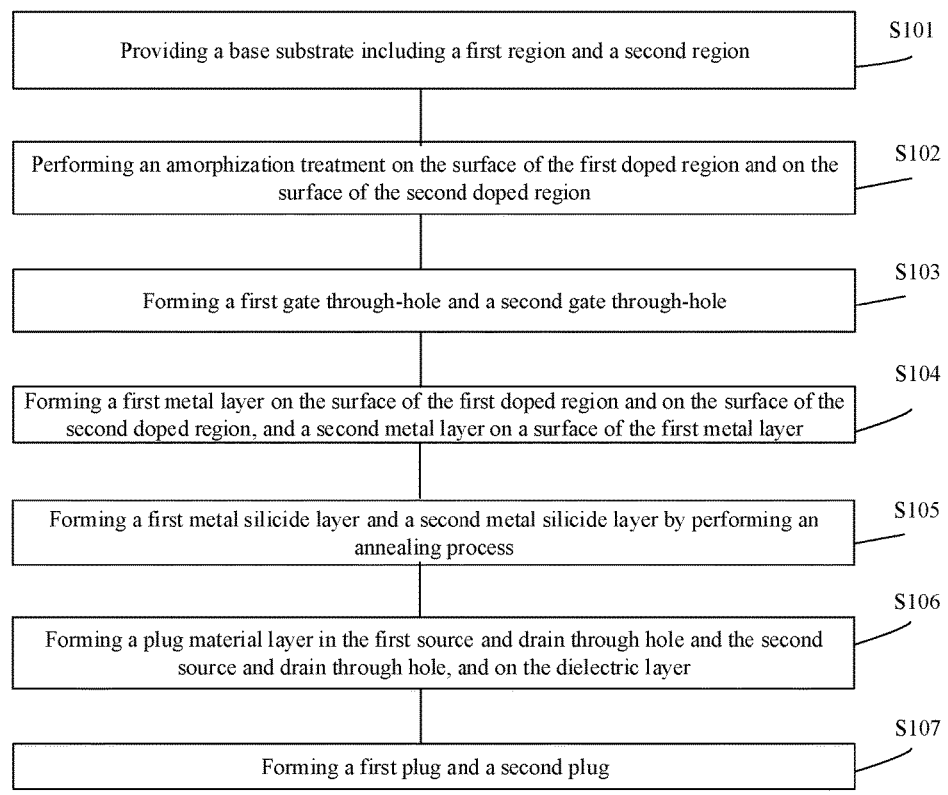
FIG. 8 illustrates an exemplary fabrication method for forming a semiconductor device consistent with various disclosed embodiments of the present disclosure.

FIG. 8 illustrates an exemplary fabrication method for forming a semiconductor device consistent with various disclosed embodiments of the present disclosure; and FIGS. 1-7 illustrate semiconductor structures corresponding to certain stages of the exemplary fabrication method.

As illustrated in FIG. 8, at the beginning of the fabrication method, a base substrate with certain structures may be provided (S101). FIG. 1 illustrates a corresponding semiconductor structure.

Referring to FIG. 1, a base substrate including a first region A and a second region B may be provided. The first region A and the second region B may be used to form devices with different functions. In one embodiment, a first metal silicide layer in the first region A may be made of a material different from a second metal silicide layer in the second region B, to satisfy the requirements of different functions of formed devices corresponding to the first region A and the second region B. In one embodiment, the first region A may be used to form a P-type transistor, and the second region B may be used to form an N-type transistor.

In one embodiment, the first region A and the second region B may be used to form a fin field effect transistor (FinFET) for illustrative purposes. Correspondingly, the first region may be used to form a P-type FinFET, and the second region may be used to form an N-type FinFET. In another embodiment, the semiconductor device may be a planar MOS transistor.

In one embodiment, the base substrate may include a semiconductor substrate 100 and a plurality of fins on the semiconductor substrate 100. The plurality of fins may include a first fin 111 in the first region A, and a second fin 112 in the second region B. In another embodiment, the base substrate may be a planar semiconductor substrate.

The semiconductor substrate 100 may include monocrystalline silicon, polysilicon or amorphous silicon. The semiconductor substrate 100 may also include silicon, germanium, silicon germanium, gallium arsenide and other semiconductor materials. In one embodiment, the semiconductor substrate 100 may be a single-layer structure. In another embodiment, the semiconductor substrate 100 may be a composite structure, such as silicon on insulator (SOI). The semiconductor substrate 100 may include any appropriate other semiconductor material(s). In one embodiment, the semiconductor substrate 100 may be a monocrystalline silicon substrate.

In one embodiment, an isolation structure 103 may be formed on the semiconductor substrate 100 to cover a portion of each of a sidewall of the first fin 111 and a sidewall of the second fin 112. A top surface of the isolation structure 103 may be lower than top surfaces of first fin 111 and the second fin 112. The isolation structure 103 may be made of silicon oxide in one example.

Referring to FIG. 1, a first doped region 121 may be formed in the first region A of the base substrate, and a second doped region 122 may be formed in the second region B of the base substrate. The second doped region 122 may be doped with blocking ions, and the first doped region 121 may not be doped with the blocking ions. The blocking ions may include carbon (C) ions, fluorine (F) ions, or antimony (Sb) ions, etc. In one embodiment, the blocking ions may be carbon (C) ions.

In one embodiment, the first doped region 121 may be made of silicon germanium doped with first conductive ions, and a conductivity type of the first conductive ions may be P type. The second doped region 122 may be made of silicon doped with second conductive ions and the blocking ions, and a conductivity type of the second conductive ions may be N type.

A concentration of the blocking ions in the second doped region 122 may be in a range of approximately $1 \times 10^{18}$ atoms/cm$^3$-$1 \times 10^{21}$ atoms/cm$^3$. The concentration of the blocking ions in the second doped region 122 may be selected in an appropriate range. When the concentration of the blocking ions in the second doped region 122 is greater than $1 \times 10^{21}$ atoms/cm$^3$, manufacturing cost may increase, for example, materials may be wasted. When the concentration of the blocking ions in the second doped region 122 is less than $1 \times 10^{18}$ atoms/cm$^3$, the blocking degree of the blocking ions to the ions of the subsequent second metal layer may be small, and the blocking ions may have to have high capability of blocking ions of a second metal layer.

In one embodiment, a first gate structure 131 may be formed on the first region A of the base substrate, and a second gate structure 132 may be formed on the second region B of the base substrate. The first doped region 121 may be located on both sides of the first gate structure 131, and the second doped region 122 may be located on both sides of the second gate structure 132. A dielectric layer 140 may be formed to cover the first gate structure 131, the second gate structure 132, the first doped region 121, the second doped region 122 and the base substrate. First source and drain through-holes 151 and second source and drain through-holes 152 may be formed in the dielectric layer 140 and penetrate through the dielectric layer 140. The first source and drain through-holes 151 may be located on both sides of the first gate structure 131, respectively, and expose a surface of the first doped region 121. The second source and drain through-holes 152 may be located on both sides of the second gate structure 132, respectively, and expose a surface of the second doped region 122.

In one embodiment, the first gate structure 131 may be across a length portion of the first fin 111 and cover a portion of each of a top surface and a sidewall of the first fin 111. The first gate structure 131 may include a first gate dielectric layer 133 across the length portion of the first fin 111, and a first gate electrode layer 134 on the first gate dielectric layer 133. The second gate structure 132 may be across a length portion of the second fin 112 and cover a portion of each of a top surface and a sidewall of the second fin 112. The second gate structure 132 may include a second gate dielectric layer 135 across the length portion of the second fin 112, and a second gate electrode layer 136 on the second gate dielectric layer 135. The first gate dielectric layer 133 may be located on a portion of the surface of the isolation structure 103 in the first region A, and cover a portion of each of the top surface and the sidewall of the first fin 111. The second gate dielectric layer 135 may be located on a portion of the surface of the isolation structure 103 in the second region B, and cover a portion of each of the top surface and the sidewall of the second fin 112.

In one embodiment, the first gate dielectric layer 133 and the second gate dielectric layer 135 may be made of a high-K dielectric material (e.g., having a dielectric constant greater than 3.9). The first gate electrode layer 134 and the second gate electrode layer 136 may be made of a metal.

In one embodiment, the first doped region 121 may be formed in the first fin 111 on both sides of the first gate structure 131. The second doped region 122 may be formed in the second fin 112 on both sides of the second gate structure 132. The dielectric layer 140 may be formed on the isolation structure 103. The dielectric layer 140 may be made of silicon oxide.

In one embodiment, a first metal layer may be formed on the surface of the first doped region 121 and on the surface of the second doped region 122. A second metal layer may be formed on the surface of the first metal layer. The second metal layer may be made of a material different from the first metal layer.

In one embodiment, before forming the first metal layer, an amorphization treatment may be performed on the surface of the first doped region 121 at the bottom of the first source and drain through-hole 151 and on the surface of the second doped region 122 at the bottom of the second source and drain through-hole 152.

Figure 2:
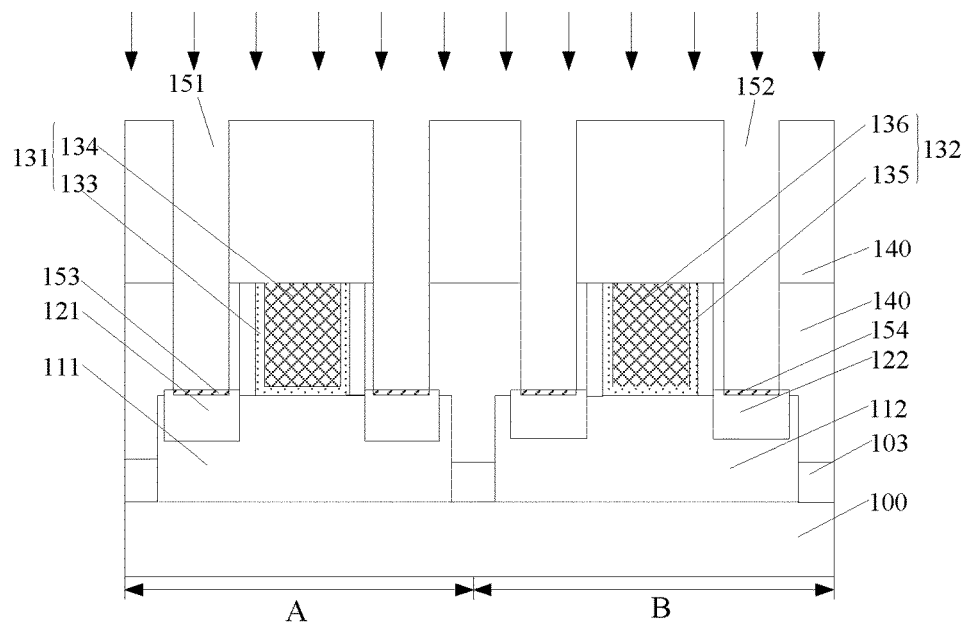

Returning to FIG. 8, after providing the base substrate, an amorphization treatment may be performed (S102). FIG. 2 illustrates a corresponding semiconductor structure.

Referring to FIG. 2, an amorphization treatment may be performed on the surface of the first doped region 121 at the bottom of the first source and drain through-hole 151 and on the surface of the second doped region 122 at the bottom of the second source and drain through-hole 152.

The amorphization treatment may enable the surface of the first doped region 121 exposed at the bottom of the first source and drain through-hole 151 to be amorphous, such that surface roughness of a subsequently formed first metal silicide layer may be low. The amorphization treatment may enable the surface of the second doped region 122 exposed at the bottom of the second source and drain through-hole 152 to be amorphous, such that surface roughness of a subsequently formed second metal silicide layer may be low.

After performing the amorphization treatment on the surface of the first doped region 121 at the bottom of the first source and drain through-hole 151 and on the surface of the second doped region 122 at the bottom of the second source and drain through-hole 152, a first amorphous layer 153 may be formed on the surface of the first doped region 121 at the bottom of the first source and drain through-hole 151, and a second amorphous layer 154 may be formed on the surface of the second doped region 122 at the bottom of the second source and drain through-hole 152.

The surface roughness of the subsequently formed first metal silicide layer may be low, such that a contact resistance between a subsequently formed first plug and the first doped region 121 may be further reduced. The surface roughness of the subsequently formed second metal silicide layer may be low, such that a contact resistance between a subsequently formed second plug and the second doped region 122 may be further reduced.

The amorphization treatment may include an ion implantation process. Ions used in the ion implantation process may be different from the blocking ions to avoid implanting the blocking ions into the first doped region 121.

In one embodiment, the ions used in the ion implantation process may be non-N-type and non-P type ions, such as germanium ions. Because the germanium ions neither belong to the N-type ions nor the P-type ions, the germanium ions may have small effect on the electrical properties of the first doped region 121 and the second doped region 122. In certain embodiments, the amorphization treatment may be optionally and may not be performed.

Figure 3:
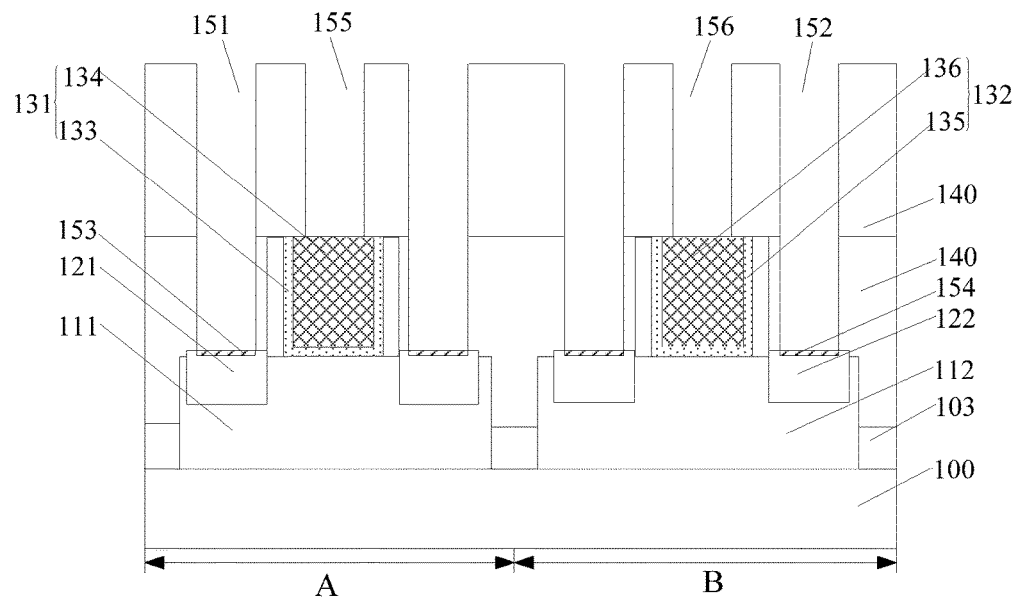

Returning to FIG. 8, after performing the amorphization treatment, a first gate through-hole and a second gate through-hole may be formed (S103). FIG. 3 illustrates a corresponding semiconductor structure.

Referring to FIG. 3, a first gate through-hole 155 may be formed in the dielectric layer 140 on the first gate structure 131 and penetrate through the dielectric layer 140, and a second gate through-hole 156 may be formed in the dielectric layer 140 on the second gate structure 132 and penetrate through the dielectric layer 140. The first gate through-hole 155 may expose a top surface of the first gate structure 131, and the second gate through-hole 156 may expose a top surface of the second gate structure 132.

In the embodiments that the amorphization treatment is performed, the first gate through-hole 155 and the second gate through-hole 156 may be formed after performing the amorphization treatment. Accordingly, the first gate structure 131 and the second gate structure 132 may not be exposed to process environments of the amorphization treatment. The corresponding ions in the ion implantation process used in the amorphization treatment may be avoided from being implanted into the first gate structure 131 and the second gate structure 132, such that the electrical performance of the first gate structure 131 and the second gate structure 132 may not be affected. Further, in the ion implantation process used in the amorphization treatment, the materials of the surfaces of the first gate structure 131 and the second gate structure 132 may be avoided from being sputtered out by the corresponding ions. In this case, a chamber of the ion implantation process may not be contaminated.

Figure 4:
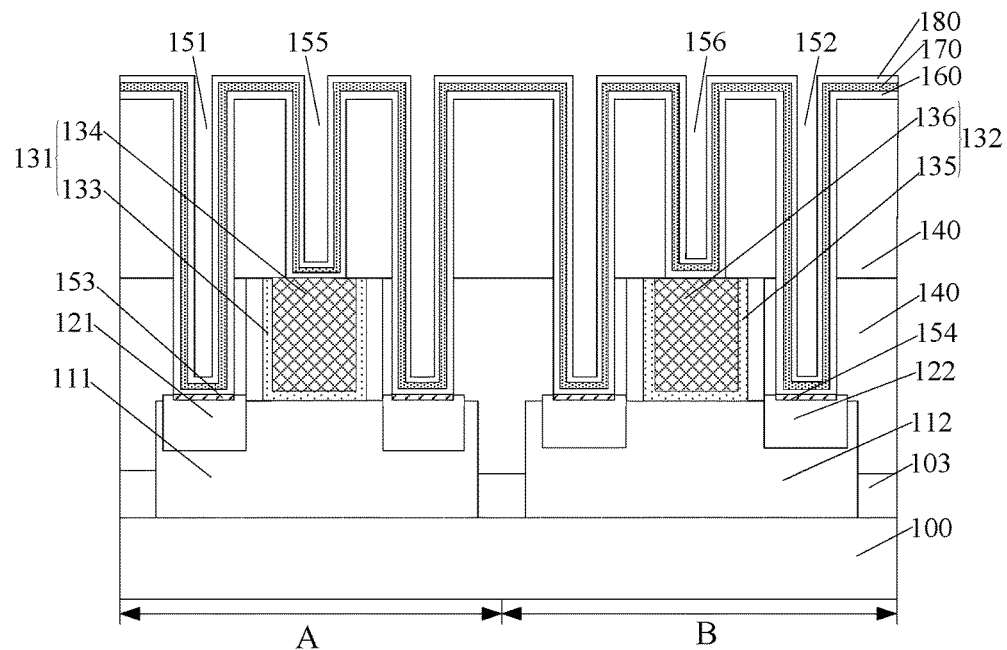

Returning to FIG. 8, after forming the first gate through-hole and the second gate through-hole, a first metal layer and a second metal layer may be formed (S104). FIG. 4 illustrates a corresponding semiconductor structure.

Referring to FIG. 4, a first metal layer 160 may be formed on the surface of the first doped region 121 and on the surface of the second doped region 122. A second metal layer 170 may be formed on the surface of the first metal layer 160. The second metal layer 170 may be made of a material different from the first metal layer 160.

In the embodiments that the amorphization treatment is performed, the first metal layer 160 may be formed after performing the amorphization treatment. In one embodiment, the first metal layer 160 may be formed on the surface of the first doped region 121 at the bottom of the first source and drain through-hole 151 and on the surface of the second doped region 122 at the bottom of the second source and drain through-hole 152. The first metal layer 160 may also be formed on the sidewall of the first source and drain through-hole 151, on the sidewall of the second source and drain through-hole 152, and on the top surface of the dielectric layer 140.

In one embodiment, a work function of the second metal layer 170 may be greater than a work function of the first metal layer 160. In one embodiment, the first metal layer 160 may be made of Ti, Ni, or Co, etc. The second metal layer 170 may be made of Pt.

If a thickness of the first metal layer 160 is too small, it may be difficult to subsequently form a first initial metal silicide layer and a second metal silicide layer. If the thickness of the first metal layer 160 is too large, materials may be wasted, and difficulty of atoms in the second metal layer 170 diffusing into the first initial metal silicide layer may increase. Therefore, the thickness of the first metal layer 160 may be in a range of approximately 30 Å-100 Å.

If a thickness of the second metal layer 170 is too small, a concentration of ions of the second metal layer in a subsequent first metal silicide layer at the interface between the first metal silicide layer and the first doped region may be small, such that it may be difficult to effectively reduce a Schottky barrier between the first metal silicide layer and the first doped region. If the thickness of the second metal layer 170 is too large, materials may be wasted. The thickness of the second metal layer 170 may be in a range of approximately 10 Å-30 Å.

The first metal layer 160 may be formed by a deposition process, e.g., a chemical vapor deposition process. The second metal layer 170 may be formed by a deposition process, e.g., a sputtering process.

In one embodiment, after forming the second metal layer 170 and before performing a subsequent annealing process, a barrier layer 180 may be formed on the sidewall and the bottom of the first source and drain through-hole 151, on the sidewall and the bottom of the second source and drain through-hole 152, and on the dielectric layer 140. The barrier layer 180 may be formed on the surface of the second metal layer 170. The barrier layer 180 may be made of TiN, or TaN, etc. The barrier layer 180 may be formed by a deposition process, e.g., a sputtering process, a chemical vapor deposition process, or an atomic layer deposition process, etc.

In one embodiment, the first metal layer 160, the second metal layer 170, and the barrier layer 180 may be formed after forming the first gate through-hole 155 and the second gate through-hole 156. Correspondingly, the first metal layer 160 may be formed on the sidewall and bottom of the first gate through-hole 155 and the sidewall and bottom of the second gate through-hole 156.

In another embodiment, the first metal layer, the second metal layer, and the barrier layer may be formed before forming the first gate through-hole and the second gate through-hole. Correspondingly, the first metal layer may not be formed on the sidewall and the bottom of the first gate through-hole and the sidewall and bottom of the second gate through-hole.

Figure 5:
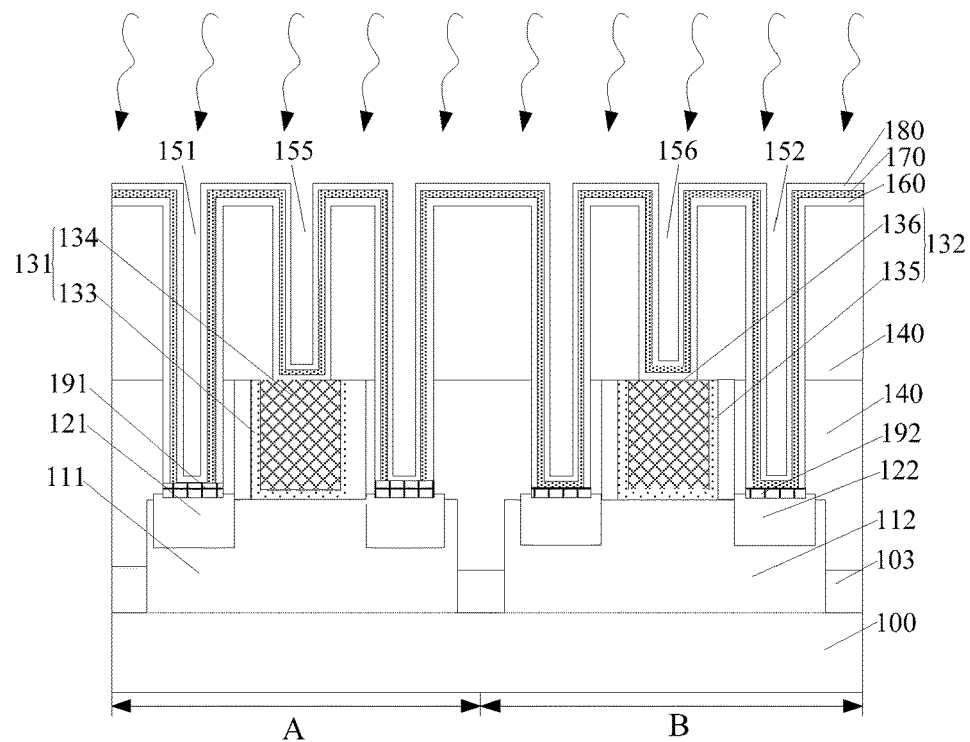

Returning to FIG. 8, after forming the first metal layer and the second metal layer, a first metal silicide layer and a second metal silicide layer may be formed (S105). FIG. 5 illustrates a corresponding semiconductor structure.

Referring to FIG. 5, by performing an annealing process, the first metal layer 160 and the second metal layer 170 on the first doped region 121 may react with a surface material of the first doped region 121 to form a first metal silicide layer 191, and the first metal layer 160 on the second doped region 122 may react with a surface material of the second doped region 122 to form a second metal silicide layer 192 including the blocking ions. The blocking ions may block the atoms of the second metal layer 170 from diffusing into the second metal silicide layer 192.

In the embodiments that the amorphization treatment is performed, the surface material of the first doped region 121 may include a portion of the first amorphous layer 153, in one embodiment. In another embodiment, the surface material of the first doped region 121 may include the entire first amorphous layer 153. In still another embodiment, the surface material of the first doped region 121 may include the entire first amorphous layer 153, and also include a portion of the first doped region 121 under the first amorphous layer 153. Similarly, the surface material of the second doped region 122 may include a portion of the second amorphous layer 154, in one embodiment. In another embodiment, the surface material of the second doped region 122 may include the entire second amorphous layer 154. In still another embodiment, the surface material of the second doped region 122 may include the entire second amorphous layer 154, and also include a portion of the second doped region 122 under the second amorphous layer 154.

In one embodiment, forming the first metal silicide layer 191 may include the following. The first metal layer 160 on the first doped region 121 may react with the surface material of the first doped region 121 under the annealing process to form the first initial metal silicide layer. The second metal layer 170 over the first doped region 121 may diffuse into the first initial metal silicide layer through the atoms of the first metal layer 160 under the annealing process to transform the first initial metal silicide layer to the first metal silicide layer 191.

Because the first doped region 121 does not have blocking ions, the first initial metal silicide layer may not have the blocking ions. Therefore, the atoms in the second metal layer 170 may diffuse into the first initial metal silicide layer to form the first metal silicide layer 191.

The second metal silicide layer 192 may be formed by a reaction between the first metal layer 160 on the second doped region 122 and the surface material of the second doped region 122. Because the second doped region 122 has the blocking ions, the second metal silicide layer 192 may have the blocking ions. The blocking ions in the second metal silicide layer 192 may block the atoms of the second metal layer 170 from diffusing into the second metal silicide layer 192, and prevent the second metal silicide layer 192 from containing the metal ions of the second metal layer 170.

In one embodiment, the work function of the second metal layer 170 may be greater than the work function of the first metal layer 160. Thus, a work function of the first metal silicide layer 191 may be greater than a work function of the second metal silicide layer 192. A Schottky barrier between the first metal silicide layer 191 and the first doped region 121 may be small, and, thus, the electrical performance of the P-type transistor may be improved. A Schottky barrier between the second metal silicide layer 192 and the second doped region 122 may be small, and, thus, the electrical performance of the N-type transistor may be improved.

When the first metal layer 160 is made of Ti and the second metal layer 170 is made of Pt, the first initial metal silicide layer may be made of TiSiGe doped with the first conductive ions, the first metal silicide layer 191 may be made of TiSiGe doped with the first conductive ions and Pt ions, and the second metal silicide layer 192 may be made of TiSi doped with second conductive ions and the blocking ions.

The annealing process may include a laser annealing. Parameters of the annealing process may include the following. A gas may include an inert gas, and an annealing temperature may be in a range of approximately 700° C.-1000° C., e.g., 800° C. or 900° C., etc. The annealing temperature may be selected in an appropriate range. When the annealing temperature is greater than 1000° C., the performance of a source-drain junction of the semiconductor device may be changed and a short-channel effect may increase. When the annealing temperature is less than 700° C., it may be difficult to form the first metal silicide layer 191 and the second metal silicide layer 192.

In one embodiment, the barrier layer 180 may be formed before performing the annealing process. During the annealing process, the barrier layer 180 may protect the first metal layer 160 and the second metal layer 170 from oxidation. In another embodiment, the barrier layer may be formed after performing the annealing process.

In one embodiment, to avoid an issue of poor stability of the barrier layer 180 caused by recrystallization of the material of the barrier layer 180 during the annealing process, the annealing temperature may be less than about 900° C.

Returning to FIG. 8, after forming the first metal silicide layer and the second metal silicide layer, a plug material layer may be formed (S106). FIG. 6 illustrates a corresponding semiconductor structure.

Referring to FIG. 6, after performing the annealing process, a plug material layer 200 may be formed in the first source and drain through hole 151 (illustrated in FIG. 5) and the second source and drain through hole 152 (illustrated in FIG. 5), and on the dielectric layer 140. The plug material layer 200 may be formed on the surface of the barrier layer 180. The plug material layer 200 may be made of a metal, e.g., tungsten. The plug material layer 200 may be formed by a deposition process, e.g., a chemical vapor deposition process.

In one embodiment, the plug material layer 200 may cover the barrier layer 180 on the sidewall and the bottom of the first source and drain through-hole 151, the barrier layer 180 on the sidewall and the bottom of the second source and drain through-hole 152, and the barrier layer 180 on the top of the dielectric layer 140. The plug material layer 200 may also cover the barrier layer 180 on the sidewall and the bottom of the first gate through-hole 155, and the barrier layer 180 on the sidewall and the bottom of the second gate through-hole 156.

Returning to FIG. 8, after forming the plug material layer, a first plug and a second plug may be formed (S107). FIG. 7 illustrates a corresponding semiconductor structure.

Referring to FIG. 7, the plug material layer 200 (illustrated in FIG. 6), the barrier layer 180, the second metal layer 170 and the first metal layer 160 on the dielectric layer 140 may be removed. Accordingly, the plug material layer 200 in the first source and drain through-hole 151 (illustrated in FIG. 5) may form a first plug 201, and the plug material layer 200 in the second source and drain through-hole 152 (illustrated in FIG. 5) may form a second plug 202. Further, the plug material layer 200 in the first gate through-hole 155 may form a third plug 203, and the plug material layer 200 in the second gate through-hole 156 may form a fourth plug 204. Because the first plug 201, the second plug 202, the third plug 203 and the fourth plug 204 are formed in a same one fabrication process, the fabrication process may be simplified.

After forming the first plug 201 and the second plug 202, the barrier layer 180 may be disposed between the first plug 201 and the first metal silicide layer 191 and between the first plug 201 and the dielectric layer 140. The barrier layer 180 may block the diffusion of atoms in the first plug 201 and the second plug 202.

In the disclosed fabrication method, the first metal layer and the second metal layer on the first doped region may react with the surface material of the first doped region to form the first metal silicide layer. The first metal layer on the second doped region may react with the surface material of the second doped region to form the second metal silicide layer. Because the second doped region has the blocking ions, the second metal silicide layer may have the blocking ions. The blocking ions may block the atoms of the second metal layer over the second doped region from diffusing into the second metal silicide layer, and prevent the second metal silicide layer from containing the metal ions of the second metal layer. The first metal silicide layer may be made of a material different from the second metal silicide layer, to satisfy the requirements of different functions of formed devices corresponding to the first region and the second region. Because the first metal silicide layer and the second metal silicide layer are formed in a same one fabrication process, the process is simplified.

Further, the first region may be used to form a P-type transistor, and the second region may be used to form an N-type transistor. The work function of the second metal layer may be greater than the work function of the first metal layer, thus, the work function of the first metal silicide layer may be greater than the work function of the second metal silicide layer. The Schottky barrier between the first metal silicide layer and the first doped region may be small, and, thus, the electrical performance of the P-type transistor may be improved. The Schottky barrier between the second metal silicide layer and the second doped region may be small, and, thus, the electrical performance of the N-type transistor may be improved.

The present disclosure also provides a semiconductor device. Referring to FIG. 7, the semiconductor device may include a base substrate including a first region A and a second region B. In one embodiment, the first region A may be used to form a P-type transistor, and the second region B may be used to form an N-type transistor. In one embodiment, the base substrate may include a semiconductor substrate 100 and a plurality of fins on the semiconductor substrate 100. The plurality of fins may include a first fin 111 in the first region A, and a second fin 112 in the second region B.

In one embodiment, the semiconductor device may include an isolation structure 103 formed on the semiconductor substrate 100 to cover a portion of each of a sidewall of the first fin 111 and a sidewall of the second fin 112. A top surface of the isolation structure 103 may be lower than top surfaces of first fin 111 and the second fin 112.

The semiconductor device may also include a first doped region 121 formed in the first region A of the base substrate, and a second doped region 122 formed in the second region B of the base substrate. The second doped region 122 may be doped with blocking ions, and the first doped region 121 may not be doped with the blocking ions. The blocking ions may include carbon (C) ions, fluorine (F) ions, or antimony (Sb) ions, etc. In one embodiment, the blocking ions may be carbon (C) ions. A concentration of the blocking ions in the second doped region 122 may be in a range of approximately $1 \times 10^{18}$ atoms/cm$^3$-$1 \times 10^{21}$ atoms/cm$^3$.

In one embodiment, the first doped region 121 may be made of silicon germanium doped with first conductive ions, and a conductivity type of the first conductive ions may be P type. The second doped region 122 may be made of silicon doped with second conductive ions and the blocking ions, and a conductivity type of the second conductive ions may be N type.

In one embodiment, the semiconductor device may include a first gate structure 131 formed on the first region A of the base substrate, and a second gate structure 132 formed on the second region B of the base substrate. The first doped region 121 may be located on both sides of the first gate structure 131, and the second doped region 122 may be located on both sides of the second gate structure 132.

In one embodiment, the first gate structure 131 may be across a length portion of the first fin 111 and cover a portion of each of a top surface and a sidewall of the first fin 111. The first gate structure 131 may include a first gate dielectric layer 133 across the length portion of the first fin 111, and a first gate electrode layer 134 on the first gate dielectric layer 133. The second gate structure 132 may be across a length portion of the second fin 112 and cover a portion of each of a top surface and a sidewall of the second fin 112. The second gate structure 132 may include a second gate dielectric layer 135 across the length portion of the second fin 112, and a second gate electrode layer 136 on the second gate dielectric layer 135.

In one embodiment, the semiconductor device may include a dielectric layer 140 covering the first gate structure 131, the second gate structure 132, the first doped region 121, the second doped region 122, and the base substrate.

In addition, the semiconductor device may include a first metal silicide layer 191 on the first doped region 121 and a second metal silicide layer 192 on the second doped region 122. The first metal silicide layer 191 may be made of a material different from the second metal silicide layer 192. A work function of the first metal silicide layer 191 may be greater than a work function of the second metal silicide layer 192. Forming the first metal silicide layer 191 and the second metal silicide layer 192 may include the following.

In one embodiment, first source and drain through-holes and second source and drain through-holes may be formed in the dielectric layer 140 and penetrate through the dielectric layer 140. The first source and drain through-holes may be located on both sides of the first gate structure 131, respectively, and expose a surface of the first doped region 121. The second source and drain through-holes may be located on both sides of the second gate structure 132, respectively, and expose a surface of the second doped region 122.

In one embodiment, an amorphization treatment may be performed on the surface of the first doped region 121 at the bottom of the first source and drain through-hole and on the surface of the second doped region 122 at the bottom of the second source and drain through-hole. After performing the amorphization treatment, a first amorphous layer may be formed on the surface of the first doped region 121 at the bottom of the first source and drain through-hole, and a second amorphous layer may be formed on the surface of the second doped region 122 at the bottom of the second source and drain through-hole. In another embodiment, the amorphization treatment may not be performed.

The amorphization treatment may include an ion implantation process. Ions used in the ion implantation process may be different from the blocking ions to avoid implanting the blocking ions into the first doped region 121. In one embodiment, the ions used in the ion implantation process may be non-N-type and non-P type ions, such as germanium ions.

In one embodiment, a first metal layer 160 may be formed on the surface of the first doped region 121 and on the surface of the second doped region 122. A second metal layer 170 may be formed on a surface of the first metal layer 160. The second metal layer 170 may be made of a material different from the first metal layer 160. The first metal layer 160 may also be formed on the sidewall of the first source and drain through-hole, and on the sidewall of the second source and drain through-hole. In one embodiment, a work function of the second metal layer 170 may be greater than a work function of the first metal layer 160. In one embodiment, the first metal layer 160 may be made of Ti, Ni, or Co, etc. The second metal layer 170 may be made of Pt.

In one embodiment, a barrier layer 180 may be formed on a surface of the second metal layer 170. The barrier layer 180 may be made of TiN, or TaN, etc. The barrier layer 180 may protect the first metal layer 160 and the second metal layer 170 from oxidation during a subsequent annealing process.

By performing an annealing process, the first metal layer 160 and the second metal layer 170 on the first doped region 121 may react with a surface material of the first doped region 121 to form the first metal silicide layer 191; and the first metal layer 160 on the second doped region 122 may react with a surface material of the second doped region 122 to form the second metal silicide layer 192 including the blocking ions. The blocking ions may block the atoms of the second metal layer 170 from diffusing into the second metal silicide layer 192.

In the embodiments that the amorphization treatment is performed, the surface material of the first doped region 121 may include a portion of the first amorphous layer and accordingly, the first metal silicide layer 191 may be a reaction product of the first and second metal layers with the portion of the first amorphous layer. In another embodiment when the surface material of the first doped region 121 includes the entire first amorphous layer, the first metal silicide layer 191 may be a reaction product of the first and second metal layers with the entire first amorphous layer. In still another embodiment when the surface material of the first doped region 121 includes the entire first amorphous layer and a portion of the first doped region 121 under the first amorphous layer, the first metal silicide layer 191 may be a reaction product of the first and second metal layers with the entire first amorphous layer and the portion of the first doped region 121 under the first amorphous layer.

Similarly, in one embodiment, the surface material of the second doped region 122 may include a portion of the second amorphous layer, and accordingly, the second metal silicide layer 192 may be a reaction product of the first metal layer with the portion of the second amorphous layer. In another embodiment when the surface material of the second doped region 122 includes the entire second amorphous layer, the second metal silicide layer 192 may be a reaction product of the first metal layer with the entire second amorphous layer. In still another embodiment when the surface material of the second doped region 122 includes the entire second amorphous layer and a portion of the second doped region 122 under the second amorphous layer, the second metal silicide layer 192 may be a reaction product of the first metal layer with the entire second amorphous layer and the portion of the second doped region 122 under the second amorphous layer.

When the first metal layer 160 is made of Ti and the second metal layer 170 is made of Pt, the first metal silicide layer 191 may be made of TiSiGe doped with the first conductive ions and Pt ions, and the second metal silicide layer 192 may be made of TiSi doped with second conductive ions and the blocking ions.

In one embodiment, the semiconductor device may include a first plug 201 in the first source and drain through-hole and a second plug 202 in the second source and drain through-hole.

In certain embodiments, a first gate through-hole may be formed in the dielectric layer 140 on the first gate structure 131 and penetrate through the dielectric layer 140, and a second gate through-hole may be formed in the dielectric layer 140 on the second gate structure 132 and penetrate through the dielectric layer 140. Accordingly, the semiconductor device may include a third plug 203, and a fourth plug 204.

In the disclosed semiconductor device, the first region may be used to form a P-type transistor, and the second region may be used to form an N-type transistor. The work function of the second metal layer may be greater than the work function of the first metal layer, thus, the work function of the first metal silicide layer may be greater than the work function of the second metal silicide layer. A Schottky barrier between the first metal silicide layer and the first doped region may be small, and, thus, the electrical performance of the P-type transistor may be improved. A Schottky barrier between the second metal silicide layer and the second doped region may be small, and, thus, the electrical performance of the N-type transistor may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those skilled in the art. Any equivalent or modification thereof, without departing from the spirit and principle of the present disclosure, falls within the true scope of the present disclosure.

What is claimed is:

1. A method for forming a semiconductor device, comprising:
    providing a base substrate, including a first region and a second region;
    forming a first doped region in the first region of the base substrate, and a second doped region in the second region of the base substrate, wherein the second doped region is doped with blocking ions;
    forming a first metal layer on a surface of the first doped region and on a surface of the second doped region;
    forming a second metal layer on a surface of the first metal layer, wherein the second metal layer is made of a material different from the first metal layer; and
    forming a first metal silicide layer and a second metal silicide layer by performing an annealing process, wherein:
    the first metal layer and the second metal layer on the first doped region react with a surface material of the first doped region to form the first metal silicide layer,
    the first metal layer on the second doped region reacts with a surface material of the second doped region to form the second metal silicide layer including the blocking ions, and
    the blocking ions block atoms of the second metal layer from diffusing into the second metal silicide layer.

2. The method according to claim 1, wherein:
    the blocking ions include one or more of carbon ions, fluorine ions, and antimony ions; and
    before forming the first metal layer, a concentration of the blocking ions in the second doped region is in a range of approximately $1\times10^{18}$ atoms/cm$^3$-$1\times10^{21}$ atoms/cm$^3$.

3. The method according to claim 1, wherein:
    the first metal layer has a thickness in a range of approximately 30 Å-100 Å; and
    the second metal layer has a thickness in a range of approximately 10 Å-30 Å.

4. The method according to claim 1, wherein:
    the first region is used to form a P-type transistor, and the second region is used to form an N-type transistor;
    a work function of the second metal layer is greater than a work function of the first metal layer; and
    a work function of the first metal silicide layer is greater than a work function of the second metal silicide layer.

5. The method according to claim 4, wherein:
    the first metal layer is made of one or more of Ti, Ni, and Co; and
    the second metal layer is made of Pt.

6. The method according to claim 1, wherein parameters of the annealing process include:
    a gas including an inert gas; and
    an annealing temperature in a range of approximately 700° C.-1000° C.

7. The method according to claim 5, wherein:
    the first doped region is made of silicon germanium doped with first conductive ions, and a conductivity type of the first conductive ions is P-type; and
    the second doped region is made of silicon doped with second conductive ions and the blocking ions, and a conductivity type of the second conductive ions is N-type.

8. The method according to claim 7, wherein:
    when the first metal layer is made of Ti and the second metal layer is made of Pt,
    the first metal silicide layer is made of TiSiGe doped with the first conductive ions and Pt ions; and
    the second metal silicide layer is made of TiSi doped with the second conductive ions and the blocking ions.

9. The method according to claim 1, further including:
    forming a first gate structure on the first region of the base substrate, and a second gate structure on the second region of the base substrate, wherein the first doped region is located on both sides of the first gate structure, and the second doped region is located on both sides of the second gate structure;

forming a dielectric layer to cover the first gate structure, the second gate structure, the first doped region, the second doped region, and the base substrate;

forming first source and drain through-holes and second source and drain through-holes in the dielectric layer and penetrating through the dielectric layer, wherein the first source and drain through-holes are respectively located on both sides of the first gate structure and expose the surface of the first doped region, and the second source and drain through-holes are respectively located on both sides of the second gate structure and expose the surface of the second doped region; and forming the first metal layer on the surface of the first doped region at a bottom of the first source and drain through-hole, and on the surface of the second doped region at a bottom of the second source and drain through-hole.

10. The method according to claim 9, before forming the first metal layer, further including:

performing an amorphization treatment on the surface of the first doped region at the bottom of the first source and drain through-hole and on the surface of the second doped region at the bottom of the second source and drain through-hole.

11. The method according to claim 10, wherein:

the amorphization treatment includes an ion implantation process;

ions used in the ion implantation process are different from the blocking ions; and the ions used in the ion implantation process include non-N-type and non-P-type ions.

12. The method according to claim 9, wherein:

the first metal layer is formed on a sidewall of the first source and drain through-hole, on a sidewall of the second source and drain through-hole, and on a top surface of the dielectric layer.

13. The method according to claim 12, wherein:

forming the first metal layer includes a chemical vapor deposition process; and forming the second metal layer includes a sputtering process.

14. The method according to claim 12, after forming the second metal layer and before performing the annealing process, further including:

forming a barrier layer on the sidewall and the bottom of the first source and drain through-hole, on the sidewall and the bottom of the second source and drain through-hole, and on the dielectric layer, wherein the barrier layer is located on a surface of the second metal layer, and the barrier layer is made of one of TiN and TaN.

15. The method according to claim 14, after performing the annealing process, further including:

forming a plug material layer in the first source and drain through hole and the second source and drain through hole, and on the dielectric layer; and removing the plug material layer, the barrier layer, the second metal layer, and the first metal layer on the dielectric layer, wherein the plug material layer in the first source and drain through-hole forms a first plug, and the plug material layer in the second source and drain through-hole forms a second plug.

16. A semiconductor device, comprising:

a base substrate, including a first region and a second region;

a first doped region in the first region of the base substrate, and a second doped region in the second region of the base substrate, wherein the second doped region is doped with blocking ions; and a first metal silicide layer on the first doped region, and a second metal silicide layer on the second doped region, wherein the first metal silicide layer is a reaction product of a first metal layer and a second metal layer on the first doped region with a surface material of the first doped region, the second metal silicide layer is a reaction product of the first metal layer on the second doped region with a surface material of the second doped region, and the second metal silicide layer includes the blocking ions.

17. The semiconductor device according to claim 16, wherein:

the blocking ions include one or more of carbon ions, fluorine ions, and antimony ions; and before forming the first metal layer, a concentration of the blocking ions in the second doped region is in a range of approximately $1 \times 10^{18}$ atoms/cm$^3$-$1 \times 10^{21}$ atoms/cm$^3$.

18. The semiconductor device according to claim 16, wherein:

the surface material of the first doped region includes at least a portion of a first amorphous layer, and the surface material of the second doped region includes at least a portion of a second amorphous layer;

each of the first amorphous layer and the second amorphous layer includes ions that are non-N-type and non-P type; and each of the first metal silicide layer and the second metal silicide layer includes the ions that are non-N-type and non-P type.

19. The semiconductor device according to claim 16, wherein:

the first region is used to form a P-type transistor, and the second region is used to form an N-type transistor;

a work function of the second metal layer is greater than a work function of the first metal layer; and a work function of the first metal silicide layer is greater than a work function of the second metal silicide layer.

20. The semiconductor device according to claim 16, further including:

a first gate structure on the first region of the base substrate, and a second gate structure on the second region of the base substrate, wherein the first doped region is located on both sides of the first gate structure, and the second doped region is located on both sides of the second gate structure;

a dielectric layer covering the first gate structure, the second gate structure, the first doped region, the second doped region, and the base substrate; and a first plug and a second plug, in the dielectric layer and connected to the first doped region and the second doped region, respectively.

* * * * *